US007548096B2

(12) United States Patent

Fujita

(10) Patent No.: US 7,548,096 B2

(45) Date of Patent: Jun. 16, 2009

(54) CURRENT TO VOLTAGE CONVERTER AND CURRENT TO VOLTAGE CONVERSION METHOD

(75) Inventor: Yuji Fujita, Shiga (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 28 days.

(21) Appl. No.: 11/808,365

(22) Filed: Jun. 8, 2007

(65) Prior Publication Data

US 2008/0012606 A1 Jan. 17, 2008

(30) Foreign Application Priority Data

Jun. 28, 2006 (JP) ............................. 2006-177499

(51) Int. Cl.

*H02M 11/00* (2006.01)
*H03F 3/45* (2006.01)

(52) U.S. Cl. ...................................................... 327/103

(58) Field of Classification Search .................. 327/103
See application file for complete search history.

(56) References Cited

FOREIGN PATENT DOCUMENTS

| | | |
|---|---|---|
| JP | 07-193474 | 7/1995 |
| JP | 2003-198476 | 7/2003 |

*Primary Examiner*—Kenneth B Wells
*Assistant Examiner*—Daniel Rojas
(74) *Attorney, Agent, or Firm*—McGinn IP Law Group, PLLC

(57) ABSTRACT

A current to voltage converter that includes a first voltage generator to generate a first voltage according to an input current. a reference voltage generator to output a first reference voltage which is higher than the first voltage, a second voltage generator to generate a second voltage which is lower than the first voltage and fluctuate with a delay in response to a fluctuation in the first voltage, a first comparing unit to compare the first reference voltage with the second voltage and select either the first reference voltage or the second voltage and a second comparing unit to compare the second reference voltage with the first voltage.

20 Claims, 8 Drawing Sheets

RELATED ART

RELATED ART

RELATED ART

RELATED ART

CURRENT TO VOLTAGE CONVERTER AND CURRENT TO VOLTAGE CONVERSION METHOD

BACKGROUND OF THE INVENTION

1. Field of the Invention

The present invention relates to a current to voltage converter, and particularly to a current to voltage converter for converting a photocurrent into a voltage to output.

2. Description of the Related Art

A photocoupler is used to electrically separate an input signal from an output signal. A photocoupler has a light emitting device and a light receiving device. A light emitting device converts an electric signal input into an optical signal and a light receiving device converts the optical signal into an electric signal to output. For example, as for a photocoupler that transmits a digital value of “H” or “L” level according to an existence of an optical signal, a current to voltage converter (I-V converter) for converting a photocurrent generated in a light receiving device including a photodiode into a voltage is used. Such I-V converter is disclosed in Japanese Unexamined Patent Application Publication No. 2003-198476 and Japanese Unexamined Patent Application Publication No. 07-193474.

FIG. 5 shows the I-V converter disclosed in Japanese Unexamined Patent Application Publication No. 2003-198476. In the I-V converter of the related art, a voltage Va based on a photocurrent generated by a light receiving device is generated by a voltage generator 20. In a threshold voltage generator 70, a threshold voltage Vth is generated for evaluating whether the voltage Va generated by the voltage generator 20 is “H” or “L” level. Then a comparing unit 60 compares the Va and Vth to output a digital signal of “H” or “L” level to a subsequent circuit.

In the I-V converter, the threshold voltage Vth for evaluating “H” and “L” is generated as follows. If a constant current source I4 shown in FIG. 5 is in on state, the threshold Vth is set to Vth=Va−(I4−I3)*R4. If I4 is in off state, the threshold Vth is set to Vth=Va+I3*R4. With no photocurrent input, the constant current source I4 is referred to as off state and the threshold voltage Vth is set higher than the voltage Va. On the other hand, with photocurrent input, the constant current source I4 is referred to as on state and the threshold voltage Vth is set lower than the voltage Va (see FIG. 6). By changing the threshold in this way, a pulse distortion at a rising and a falling edge of an input signal is prevented in Japanese Unexamined Patent Application Publication No. 2003-198476.

However in the I-V converter, both Va and Vth are unstable at a power-on. Therefore as shown in FIG. 7, when evaluating to be Va>Vth even with no photocurrent input and a signal of a state with a photocurrent input is output, also as shown in FIG. 8, it has now been discovered that a signal of a state with no photocurrent input is sometimes output even if there is a photocurrent input.

SUMMARY

In one embodiment of the present invention, there is provided a current to voltage converter that includes a first voltage generator to generate a first voltage according to an input current. a reference voltage generator to output a first reference voltage which is higher than the first voltage, a second voltage generator to generate a second voltage which is lower than the first voltage and fluctuate with a delay in response to a fluctuation in the first voltage, a first comparing unit to compare the first reference voltage with the second voltage and select either the first reference voltage or the second voltage and a second comparing unit to compare the second reference voltage with the first voltage.

With the current to voltage converter of the embodiment, it is possible to prevent from pulse width distortion generated by delay time at a rising and falling of an input signal. Further, incorrect output generated immediately after a power-on can be prevented.

In another embodiment of the present invention, there is provided A method for converting from current to voltage includes generating a first voltage according to an input current, outputting a second voltage having a predetermined voltage difference with the first voltage and fluctuating with a delay in response to the first voltage, selecting either the first reference voltage or the second voltage as a second reference voltage based on a first comparing result of the first reference voltage and the second voltage and comparing the first voltage with the second reference voltage to output a voltage based on a second comparison result. With the current to voltage conversion method of the embodiment, it is possible to prevent from pulse width distortion generated by delay time at a rising and falling of an input signal. Further, incorrect output generated immediately after a power-on can be prevented.

With the current to voltage converter, it is possible to output a stable signal.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
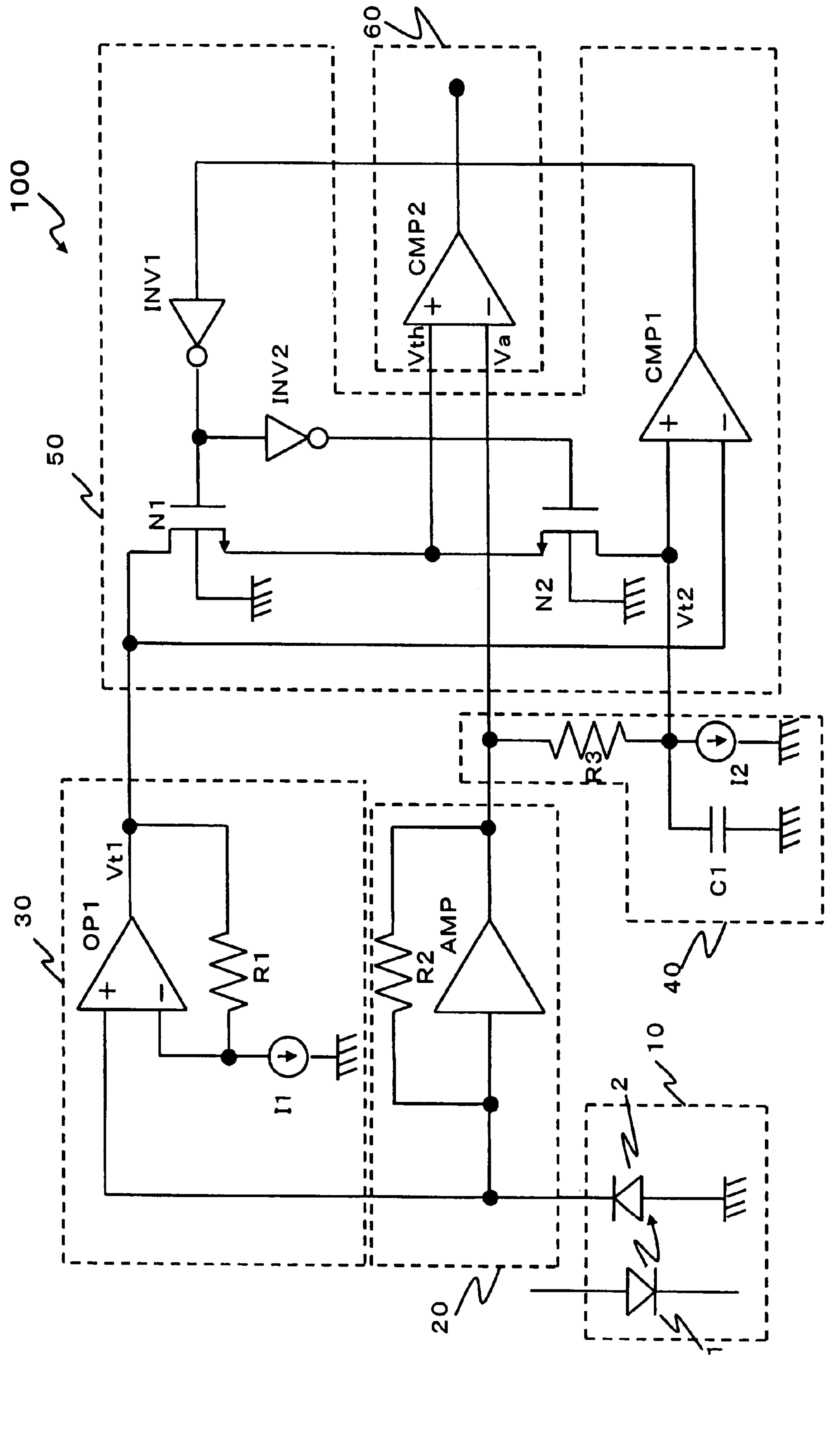
FIG. 1 shows a current to voltage converter 100 according to a first embodiment of the present invention.

An embodiment of the present invention will be described hereinafter in detail with reference to the drawings. FIG. 1 is a block diagram showing an I-V converter according to a first embodiment of the present invention. As shown in FIG. 1, the I-V converter of this embodiment includes a photocurrent generator 10, first voltage generator (hereinafter referred to as a voltage generator) 20), reference voltage generator (hereinafter referred to as a threshold voltage generator 30), second voltage generator (hereinafter referred to as a threshold voltage generator 40), first comparing unit (hereinafter referred to as a switch unit 50) and second comparing unit (hereinafter referred to as a comparing unit 60). Detailed configuration of each block is described in later.

A light emitting device and a light receiving device are paired inside the photocurrent generator 10. In the photocurrent generator 10, an electrical signal input to the light emitting device is converted into an optical signal. In the photocurrent generator 10, the light receiving device receives the optical signal, converts again into an electric signal to output. The light emitting device and the light receiving device are electrically separated in the photocurrent generator 10.

The voltage generator 20 converts the photocurrent output from the photocurrent generator 10 into a voltage Va to output. The voltage output from the voltage generator 20 changes according to fluctuation of the photocurrent input to the voltage generator 20.

The threshold voltage generator 30 outputs a voltage Vt1, which is an amplified voltage of the voltage from an output unit of the photocurrent generator 10. Incidentally, as the voltage from the output unit of the photocurrent generator 10 is almost constant, the voltage Vt1 output by the threshold voltage generator 30 is also almost constant. The threshold voltage generator 40 generates a threshold voltage Vt2 according to the voltage output from the voltage generator 20 to output.

The switch unit 50 compares the voltage Vt1 output by the threshold voltage generator 30 with the voltage Vt2 output by the threshold voltage generator 40 and output a higher voltage to the comparing unit 60. The comparing unit 60 compares either one of the voltage Vt1 output by the threshold voltage generator 30 or the voltage Vt2 output by the threshold voltage generator 40 with the voltage Va output by the voltage generator 20 to output a digital signal of "H" or "L" level.

As set forth above, by comparing the voltage Va output by the voltage generator 20 with the voltage Vt1 output by the threshold voltage generator 30 or the voltage Vt2 output by the threshold voltage generator 40, the comparing unit 60 outputs a digital signal of "H" or "L" level. Detailed structure of each block in the I-V converter 100 is described hereinafter in detail.

The photocurrent generator 10 is constituted of a photocoupler. The photocoupler includes a light emitting diode 1 and a photodiode 2. An anode electrode of the photodiode 2 is connected to a ground potential and a cathode electrode is connected to an input unit of the voltage generator 20. The voltage generator 20 constitutes a transimpedance amplifier by an amplifier AMP and a second resistance R2. Further, the resistance R2 and amplifier AMP are connected in parallel.

The threshold voltage generator 30 includes a first operational amplifier OP1, first resistance R1 and first constant current source I1. The operational amplifier OP1 and resistance R1 constitute a amplifier. The output unit of the photocurrent generator 10 is connected to a noninverting input terminal of the OP1. Further, the ground potential is connected to an inverting input terminal of the OP1 via the constant current source I1. The resistance R1 is connected between a node between the inverting input terminal and the constant current source I1 and an output terminal of the OP1. The threshold voltage generator 40 includes a third resistance R3, second constant current source I2 and capacitor C1. One end of the resistance R3 is connected to an output unit of the voltage generator 20 and another end is connected to the constant current source I2. Further, another end of the constant current source I2 is connected to the ground potential. Furthermore, the capacitor C1 is connected between a node between the resistance R3 and constant current source I2 and the ground potential. Note that the constant current source I2 and capacitor C1 are connected in parallel.

The switch unit 50 includes a first switch (hereinafter referred to as a first transistor N1), a second switch (hereinafter referred to as a second transistor N2), first and second inverters INV1 and INV2 and a first comparator CMP1. The output voltage Vt1 by the threshold voltage generator 30 is input to an inverting input terminal of the comparator CMP1 and voltage Vt2 of the node between the resistance R3 and constant current source I2 is input to a noninverting input terminal of the comparator CMP1. Further, a gate of NMOS transistor N1 is connected to an output terminal of the comparator CMP1 via INV1. Furthermore, a drain of the NMOS transistor N1 is connected to an output of the threshold voltage generator 30 and a source is connected to a noninverting input terminal of the comparator CMP2. Moreover, the output terminal of the comparator CMP1 is connected to a gate of the NMOS transistor N2 via the inverters INV1 and INV2 that are connected in series. A drain of the N2 is connected with a node between the resistance R3 and constant current source and a source is connected to the noninverting input terminal of the comparator CMP2.

The comparing unit 60 is constituted of the second comparator CMP2. The output voltage Va of the voltage generator 20 is input to an inverting input terminal of CMP2. Further, either one of the voltage Vt1 output by the threshold voltage generator 30 or the voltage Vt2 output by the threshold voltage generator 40 is input to the noninverting input terminal of CMP2 by a switching operation of the switch unit 50.

Figure 2:
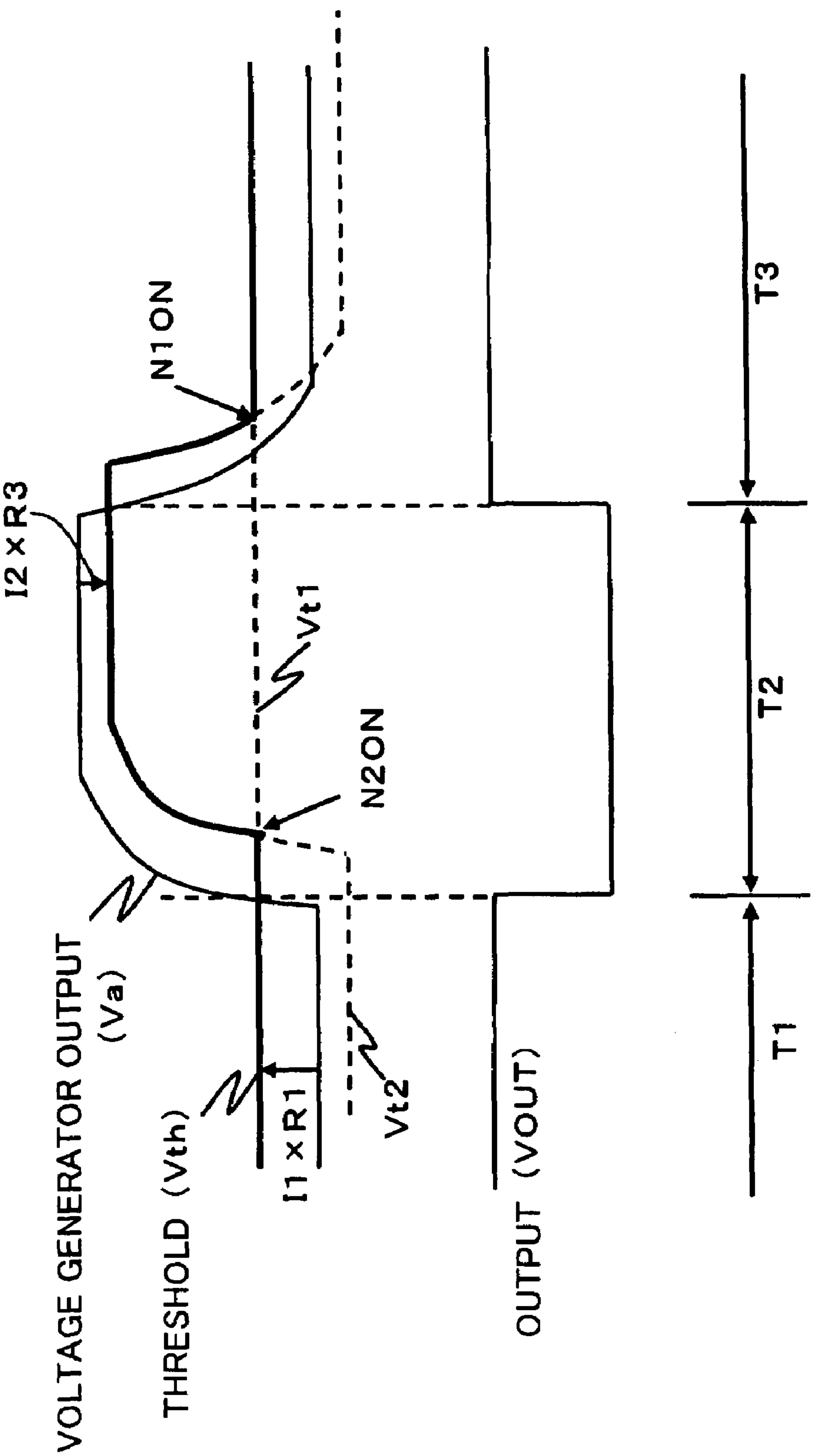
FIG. 2 shows an operating waveform for the current to voltage converter 100 according to the first embodiment of the present invention.

FIG. 2 shows an operating waveform of the current to voltage converter shown in FIG. 1. Detailed operations of the I-V converter 100 of this embodiment are described hereinafter in detail with reference to FIGS. 1 and 2.

When an optical signal is output by the light emitting diode 1, the photodiode 2 receives the optical signal transferred from the light emitting diode 1 and outputs a current signal. Here, a current flowing to the input terminal of the voltage generator 20 is referred to as Ia. The voltage generator 20 outputs the voltage Va generated by Ia×R2. The first voltage (hereinafter referred to as the voltage Va) output by the voltage generator 20 is input to the inverting input terminal of the comparator CMP2.

Assuming that the voltage in the input terminal of the voltage generator 20 to be Vt, the voltage applied to the noninverting input terminal of OP1 is also Vt. By a virtual short-circuit, the inverting input terminal has the same voltage Vt. Thus the voltage output by the threshold voltage generator 30 is a voltage higher than the input terminal Vt by a voltage of I1×R2. To be precise, the voltage Vt changes by 1/Ga (where Ga is an amplification factor of the amplifier AMP) of an amplitude for the voltage Vt. However as Ga is usually about 100 to 1000, the voltage Vt can be regarded as almost constant. Accordingly the first reference voltage (hereinafter referred to as a voltage Vt1) output by the threshold voltage generator 30 is also almost constant (see FIG. 2). The voltage Vt1 output by the threshold voltage generator 30 is input to the inverting input terminal of the comparator CMP1.

Furthermore, the voltage Va output by the voltage generator 20 is input to the threshold voltage generator 40. The threshold voltage generator 40 generates a second voltage (hereinafter referred to as the voltage Vt2) that is lower than the voltage Va by a voltage of I2×R3 due to a voltage drop generated by the constant current source I2 and resistance R3. In such case, as the constant current source I2 and capacitor C1 are connected in parallel, there is a certain degree of delay generated in the change of the voltage Vt2 output by the threshold voltage generator 40 as compared to the change of the voltage Va output by the voltage generator 20.

As set forth above, Vt1 is input to the inverting input terminal of the comparator CMP1 and Vt2 is input to the noninverting input terminal. In this embodiment, a second reference voltage (hereinafter referred to as a threshold voltage Vth) that is input to the noninverting input terminal of the comparator CMP2 is specified according to the relationship in size between Vt1 and Vt2.

Supposing $Vt1>Vt2$, the comparator CMP1 outputs a "L" level signal. In such case, a "H" level signal that is inverted via INV1 is input to the gate of the NMOS transistor Ni. This makes N1 to be in on state. Further, a "L" level signal is input to the gate of N2 as the signal passes through INV1 and INV2. This makes N2 to be in off state. Accordingly the voltage Vt1 is input to the noninverting input terminal of the comparator CMP2.

Supposing $Vt1<Vt2$, the comparator CMP1 outputs a "H" level signal. In such case, a "H" level signal is input to the gate of the NMOS transistor N2 as the signal passes through INV1 and INV2 that are connected in series. This makes N2 to be in on state. Further, a "L" level signal is input as the signal passes through INV1 to the gate of N1. This makes N1 to be in off state. Thus the voltage Vt2 is input to the noninverting input terminal of the comparator CMP2. Therefore, as for a value input to the noninverting input terminal of the comparator CMP2 as the threshold voltage Vth, a voltage of higher level between the voltages Vt1 and Vt2 is selected at any time. Note that in this embodiment, a NMOS transistor and an inverter are used for the switch unit 50 to output either of the voltage Vt1 or Vt2, for example a PMOS transistor may be used as long as either of the voltage Vt1 or Vt2 is output.

As set forth above, as for a value input to the noninverting input terminal of the comparator CMP2 as the threshold voltage Vth, a higher voltage between the voltages Vt1 and Vt2 is selected. Further, Va is input to the inverting input terminal of the comparator CMP2. Here, a voltage output operation of the I-V converter 100 is described in detail.

With no optical input (see T1 in FIG. 2), the relation is $Vt1>Va>Vt2$, thus $Vt1>Vt2$. Therefore the Vt1 is selected for the threshold voltage Vth. In such case, the relation between the voltages Vt1 and Va that are input to the comparator CMP2 is $Vt1>Va$. Thus the comparator CMP2 outputs a "H" level signal.

When a photocurrent is input (see T2 in FIG. 2), the voltage Va output by the voltage generator 20 increases along with the increase in the current of an input terminal. Further, when the voltage Va increases to be $Va>Vt1$, CMP2 outputs a "L" level signal. Furthermore, the voltage Vt2 increases in response to the increase in the voltage Va. After that when the relation becomes $Vt1<Vt2$, the threshold voltage Vth switches from Vt1 to Vt2 (see N2ON in FIG. 2).

Then, when an input level of the photocurrent decreases (see T3 in FIG. 2), the voltage Va output by the voltage generator 20 decreases. Further, when the voltage Va decreases to be $Va<Vt2$, CMP2 outputs a "H" level signal. Furthermore, the voltage Vt2 decreases in response to a decrease in the voltage Va2. After that when the relation becomes $Vt1>Vt2$, the threshold voltage Vth switches from Vt2 to Vt1 (see N1ON in FIG. 2). By repeating the above-mentioned operation, the I-V converter of this embodiment outputs a "H" or "L" level signal according to changes in the optical input level.

Figure 3:
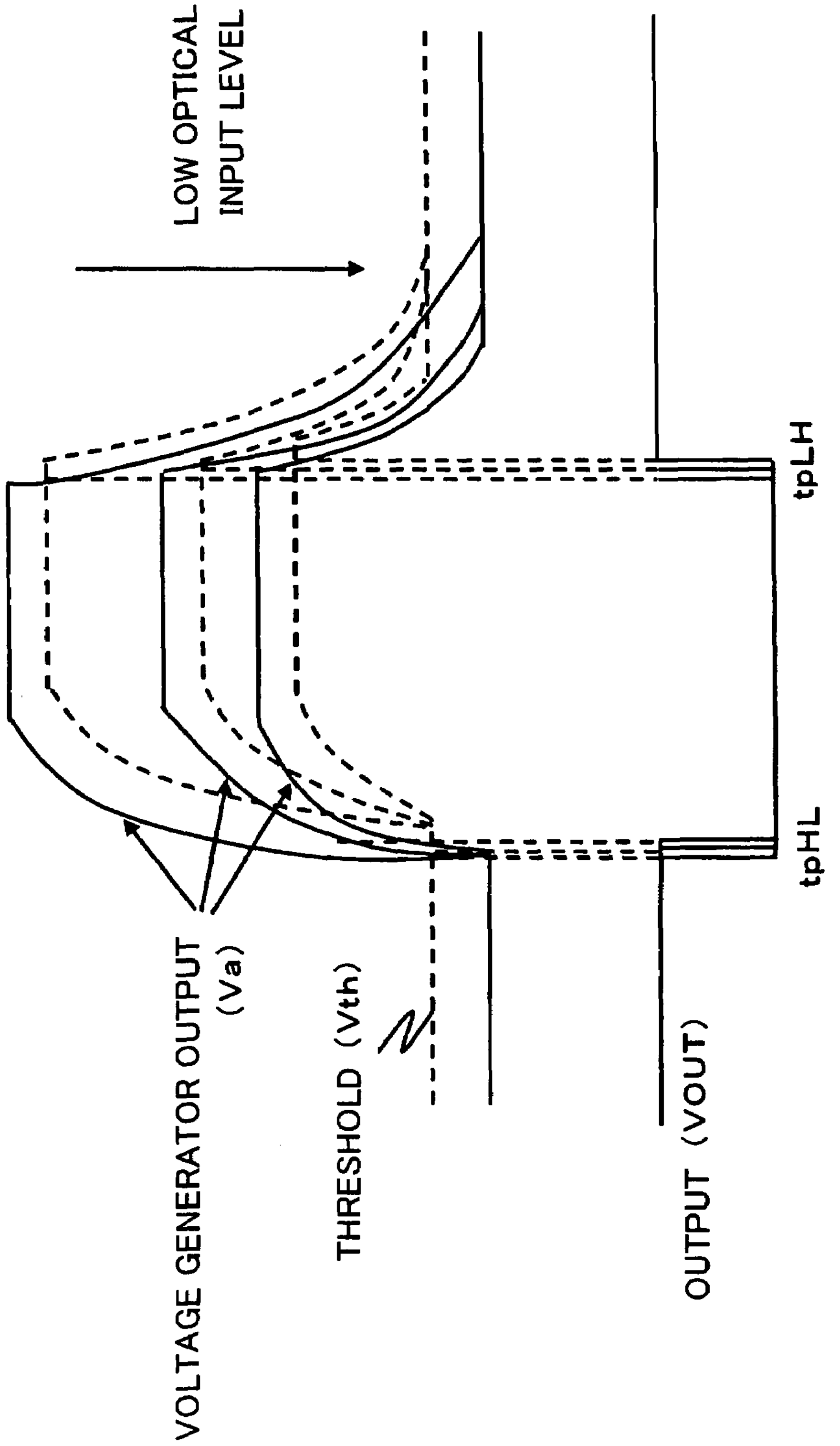
FIG. 3 shows an operating waveform for the current to voltage converter 100 according to the first embodiment of the present invention.

In the I-V converter 100 of this embodiment, a case is described in which an input signal level changes in consideration over the operational waveform shown in FIG. 2 of the embodiment. FIG. 3 shows the change in rising and falling time in the output voltage of the embodiment when an input signal changes.

FIG. 3 shows the delay time (tpLH) at a rising time and delay time (tpHL) at a falling time for an output signal that is generated when the relationship in size between the voltage Va output from the voltage generator 20 and threshold voltage Vth is inversed in case the optical signal input signal decreases. In such case, the delay time (tpHL) at a falling time increases as the optical input level decreases. Further, the delay time (tpLH) at arising time increases as the optical input level decreases.

Figure 4:
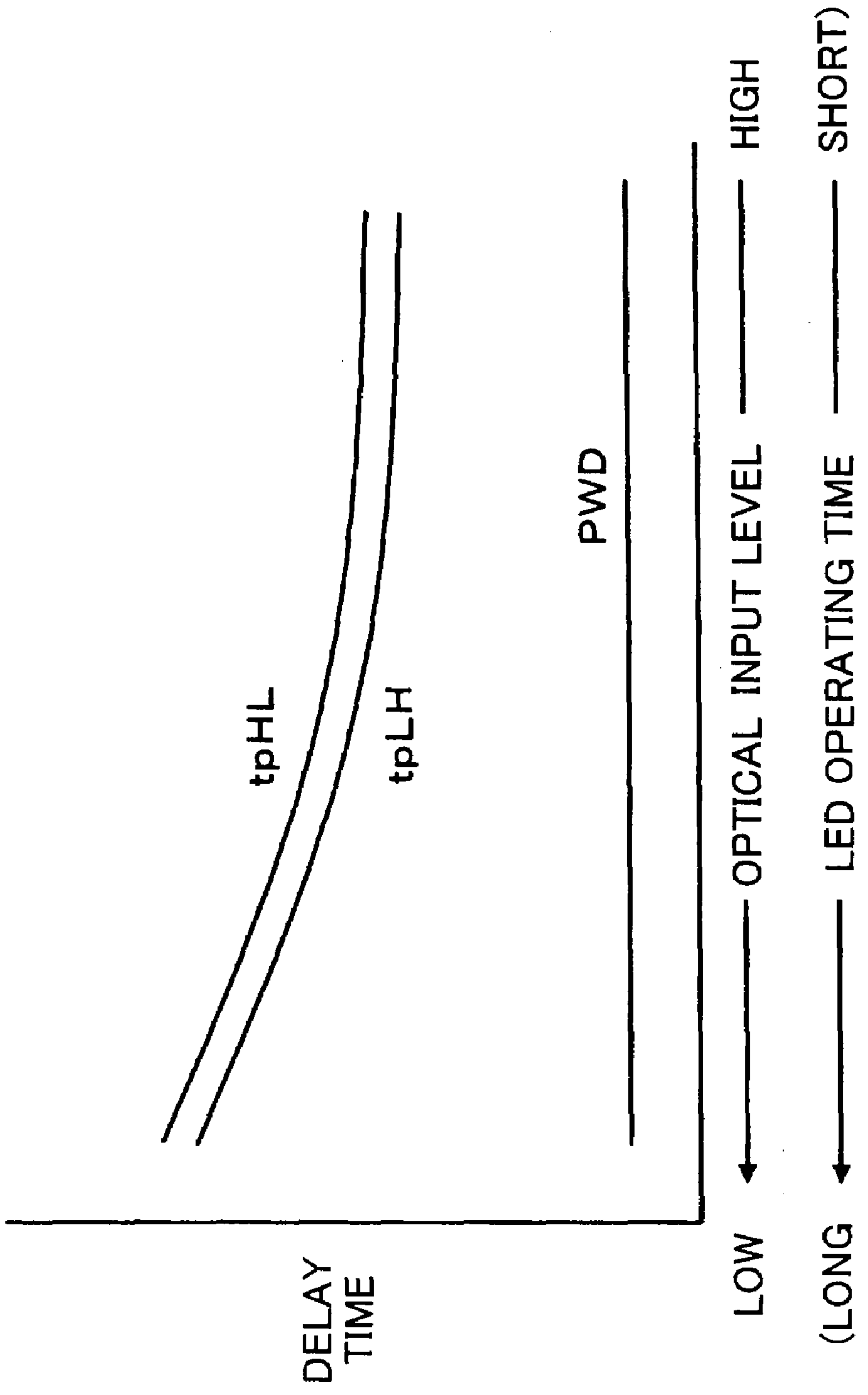
FIG. 4 shows an operating waveform for the current to voltage converter 100 according to the first embodiment of the present invention.
Figure 5:
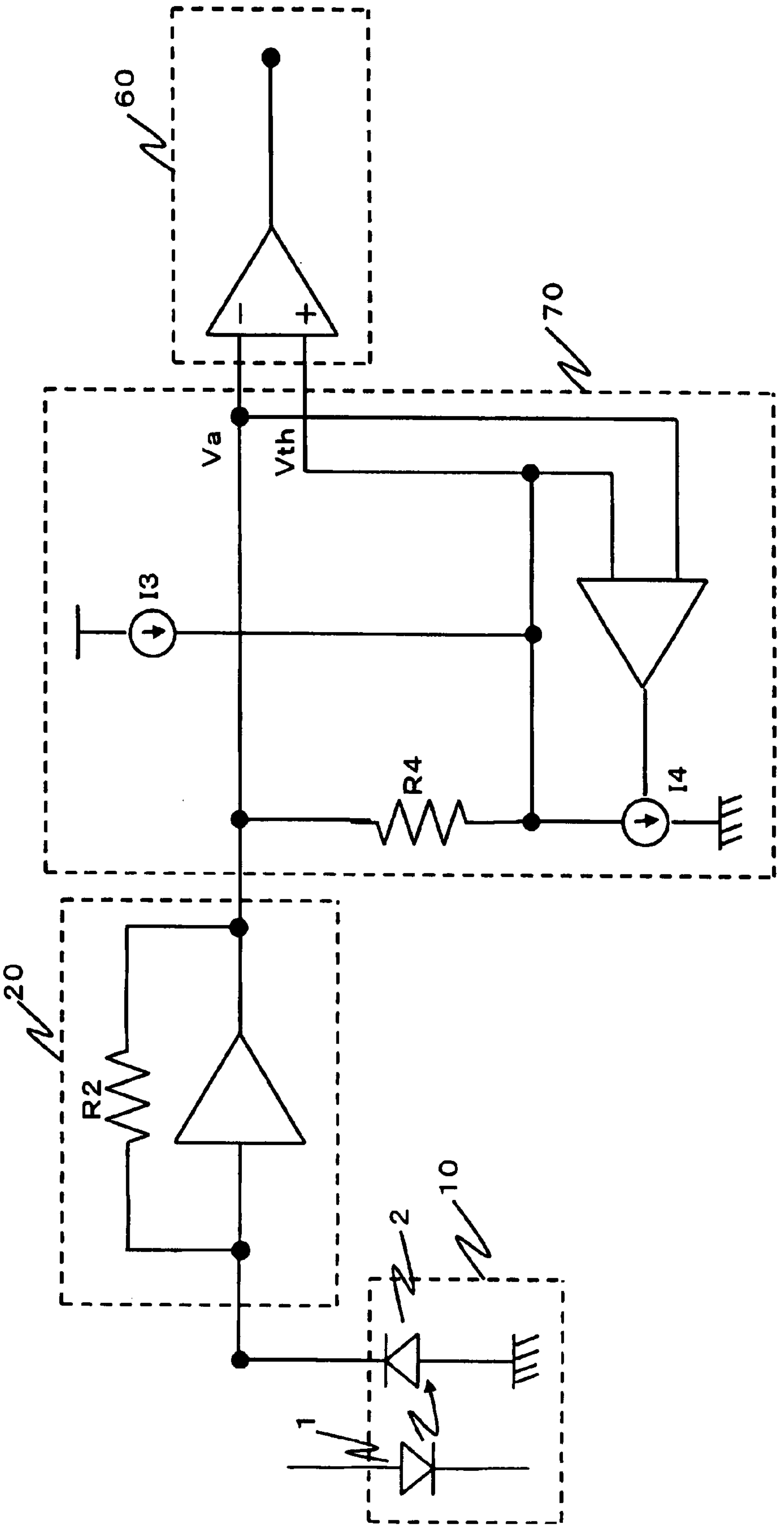
FIG. 5 shows a conventional current to voltage converter.
Figure 6:
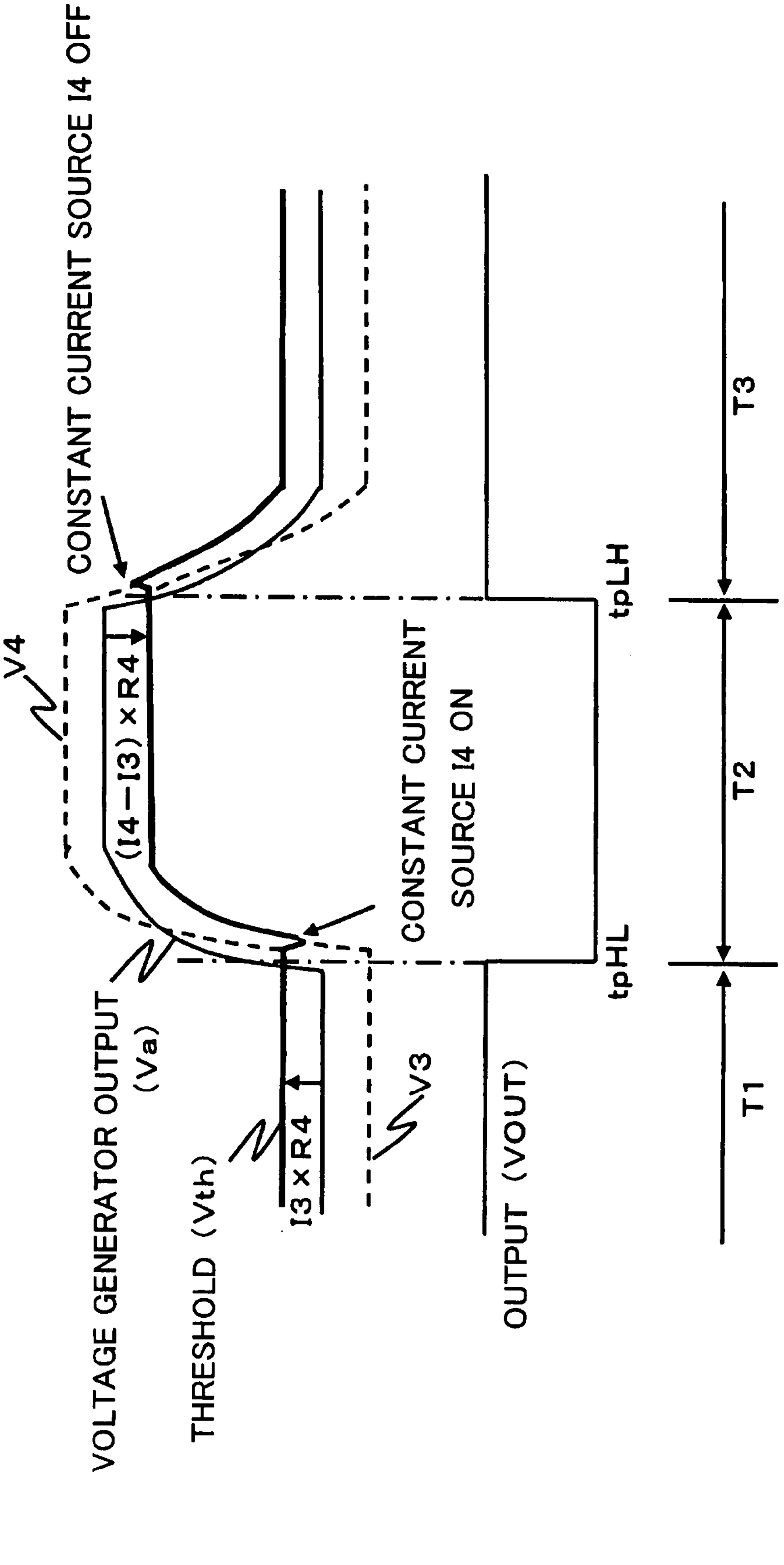
FIG. 6 shows an operating waveform for the conventional current to voltage converter.
Figure 7:
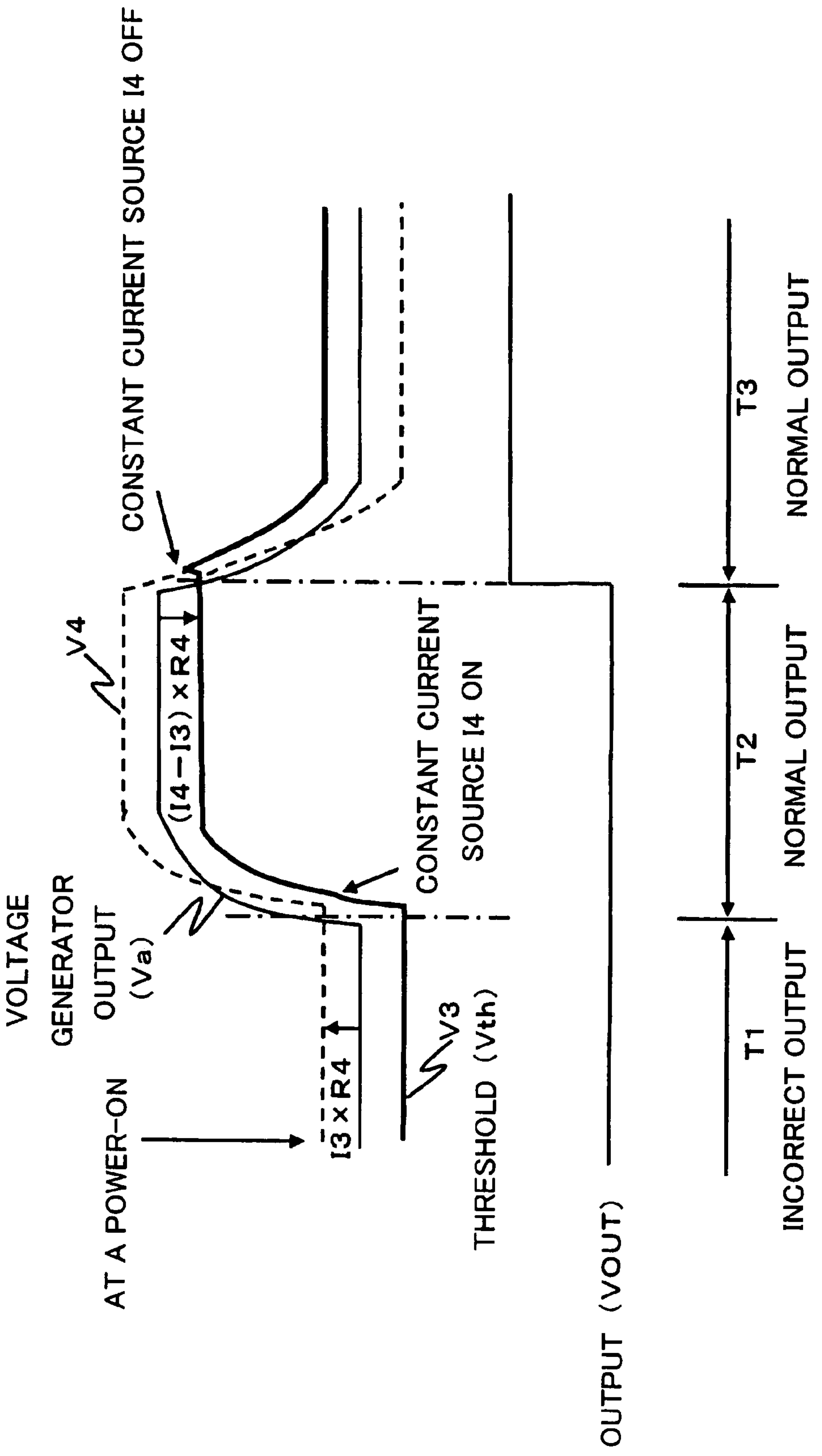
FIG. 7 shows an operating waveform for the conventional current to voltage converter.
Figure 8:
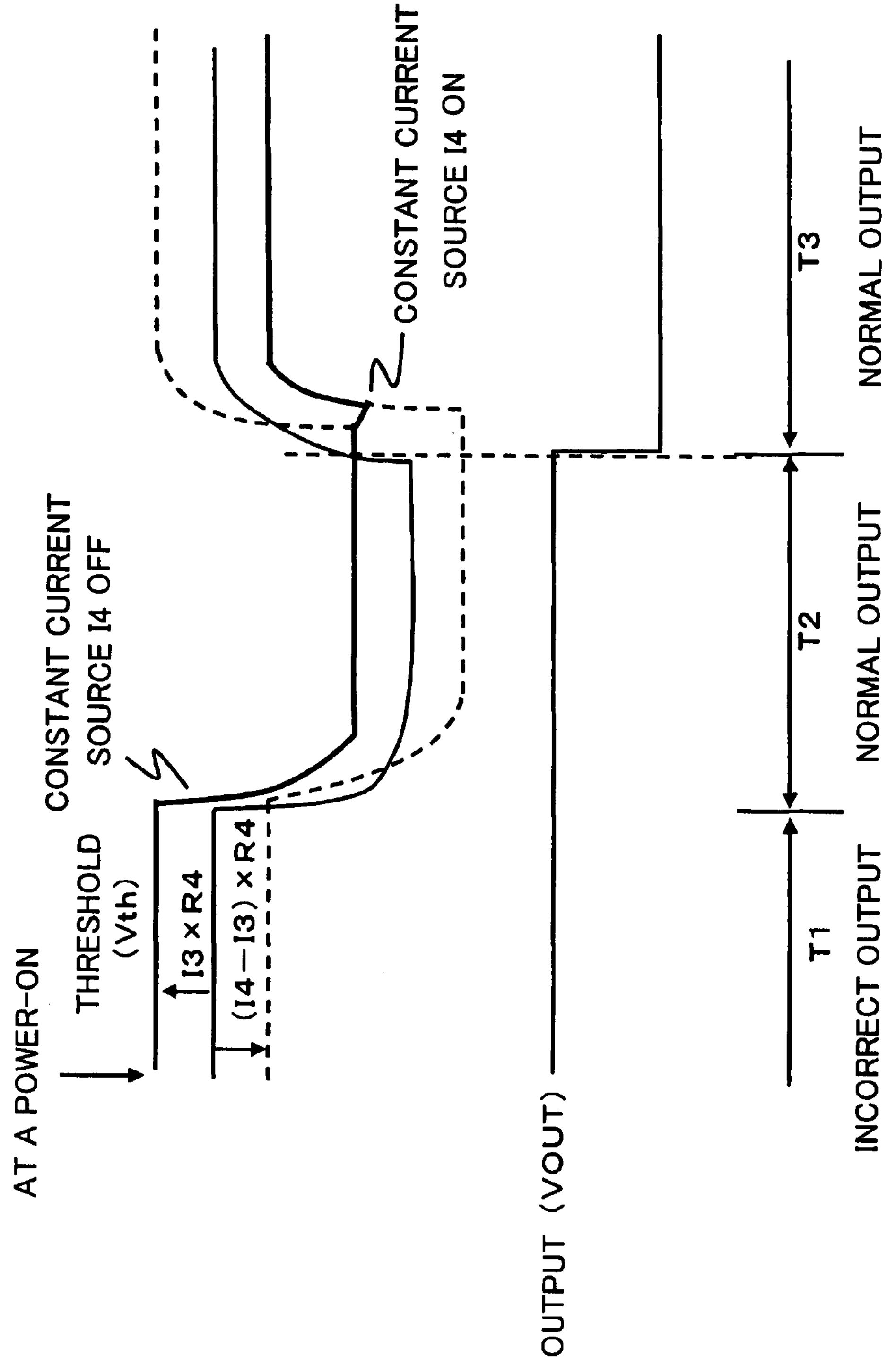
FIG. 8 shows an operating waveform for the conventional current to voltage converter.

FIG. 4 shows the change in the delay time of the embodiment according to the relationship in size of the optical input level. As the optical input level decreases, the delay time (tpLH) at a rising time increases but the delay time (tpHL) at a falling time also increases. Thus the pulse width distortion PWD($=|tpLH-tpHL|$) becomes constant. As set forth above, pulse width distortion can be prevented, where the pulse width distortion is generated due to the delay time at a rising and falling time of an input signal.

As set forth above, an operation of the I-V converter of this embodiment is described. In this embodiment, the voltage Va based on the photocurrent generated by the photocurrent generator 10 is generated by the voltage generator 20. Further, the threshold voltage Vth is generated to evaluate whether the voltage Va is "H" or "L" level signal. In such case, the voltage Vt2 that is lower than Va by a voltage of I2×R3 and the voltage Vt1 that is higher than the voltage in the output unit of the photocurrent generator 10 by a voltage of I1×R1 are provided to the threshold voltage Vth. Then either one of Vt1 or Vt2 is set to the threshold voltage Vth. By comparing the relationship in size between the voltage Va and threshold voltage Vth, a "H" or "L" level signal is output.

With no photocurrent input, Vt1 ($>Va$) is set to the threshold voltage Vth, while with photocurrent input, Vt2($<Va$) is set to the threshold voltage Vth. By setting the threshold voltage Vth in this way, a difference between the delay time tpHL and tpLH becomes almost same. Further, the difference between the delay time tpHL and tpLH is almost constant even if a photocurrent changes and decreases by chance. Accordingly it is possible to prevent pulse width distortion generated due to the delay time at a rising and falling time of an input signal. Further, by equalizing a voltage difference between the voltage Va generated by the voltage generator 20 and Vt1 with a voltage difference between Va and Vt2, a difference between the delay time tpHL and tpLH can be further smaller.

Further, at a power-on of the I-V converter of this embodiment, by setting a threshold to $Va<Vt(Vth)$ even with no photocurrent input, a normal "L" level signal is output. Furthermore, by setting a threshold to $Va>Vth$ when a photocurrent is input at a power-on, a normal "H" level signal is output. By setting the threshold voltage in this way, it is possible to prevent false operations.

It is apparent that the present invention is not limited to the above embodiment but may be modified and changed without departing from the scope and spirit of the invention.

What is claimed is:

1. A current to voltage converter, comprising:

a first voltage generator to generate a first voltage according to an input current;

a reference voltage generator to output a first reference voltage which is higher than the first voltage;

a second voltage generator to generate a second voltage which is lower than the first voltage and fluctuate with a delay in response to a fluctuation in the first voltage;

a first comparing unit to compare the first reference voltage with the second voltage and select either the first reference voltage or the second voltage; and a second comparing unit to compare a second reference voltage with the first voltage, said second reference voltage being selected as one of the first reference voltage and the second voltage.

2. The current to voltage converter according to claim 1, wherein the first comparing unit comprises:

a first switch to output the first reference voltage as the second reference voltage; and a second switch to output the second voltage as the second reference voltage.

3. The current to voltage converter according to claim 2, wherein the first comparing unit comprises:

a comparator to compare the first reference voltage with the second voltage to control conductive status of the first or the second switch according to the comparison result.

4. The current to voltage converter according to claim 1, wherein the second voltage generator comprises:

a resistance and a constant current source connected in series between an output unit of the first voltage and a ground potential; and a capacitor connected in parallel with the constant current source.

5. The current to voltage converter according to claim 4, wherein the second voltage generator outputs a voltage as the second voltage, the voltage being the first voltage dropped by the resistance.

6. The current to voltage converter according to claim 1, wherein the reference voltage generator comprises:

an operational amplifier having a noninverting input terminal connected with an input potential of the first voltage generator;

a resistance connected between an output of the operational amplifier and an inverting input terminal; and a constant current source connected between the inverting input and ground.

7. A method for converting from current to voltage, the method comprising:

generating a first voltage according to an input current;

outputting a second voltage having a predetermined voltage difference with the first voltage and fluctuating with a delay in response to the first voltage;

selecting either of a first reference voltage or the second voltage as a second reference voltage based on a first comparing result of the first reference voltage and the second voltage; and comparing the first voltage with the second reference voltage to output a voltage based on a second comparison result.

8. The current to voltage converter according to claim 1, further comprising:

a photocurrent generator comprising a light emitting device and a light receiving device, wherein the photocurrent generator converts an electrical signal input to the light emitting device into an optical signal.

9. The current to voltage converter according to claim 8, wherein, as the voltage from the output unit of the photocurrent generator is almost constant, the voltage output by the second voltage generator is also almost constant.

10. The current to voltage converter according to claim 8, wherein the reference voltage generator comprises:

a first operational amplifier associated with the first comparing unit;

a first resistance associated between an input and an output of the first operational amplifier; and a first constant current source associated with the first operational amplifier and the first resistance.

11. The current to voltage converter according to claim 10, wherein an output unit of the photocurrent generator is connected to a noninverting input terminal of the first operational amplifier.

12. The current to voltage converter according to claim 10, wherein a ground potential is connected to an inverting input terminal of the first operational amplifier via the first constant current source.

13. The current to voltage converter according to claim 10, wherein the first resistance is connected between a node located between an inverting input terminal of the first operational amplifier and an output terminal of the first operational amplifier.

14. The current to voltage converter according to claim 4, wherein one end of the resistance is connected to an output unit of the first voltage generator and another end of the resistance is connected to an end of a second constant current source, and wherein another end of the second constant current source is connected to a ground potential.

15. The current to voltage converter according to claim 14, wherein the capacitor is connected to a node placed between the resistance and the constant current source and the ground potential.

16. A current to voltage converter, comprising:

a first voltage generator to generate a first voltage which is based on an input current;

a reference voltage generator to output a first reference voltage which is based on an input voltage of the first voltage generator;

a second voltage generator to generate a second voltage which is based on the first voltage and fluctuates with a delay in response to a fluctuation in the first voltage;

a first comparing unit to compare the first reference voltage with the second voltage, and to select one of the first reference voltage and the second voltage; and a second comparing unit to compare a second reference voltage with the first voltage, said second reference voltage being selected from one of the first reference voltage and the second voltage.

17. The current to voltage converter according to claim 16, wherein the first reference voltage is higher than the input voltage of the first voltage generator.

18. The current to voltage converter according to claim 17, wherein the second reference voltage comprises a higher voltage selected from the first reference voltage and the second voltage.

19. The current to voltage converter according to claim 16, wherein the first voltage generator comprises an amplifier including a feedback resistance between an input terminal and an output terminal, the input current being supplied to the input terminal.

20. The current to voltage converter according to claim 19, wherein the input current comprises a current based on a received light from a photodiode.

* * * * *